US006618233B1

United States Patent
Russ et al.

(10) Patent No.: US 6,618,233 B1
(45) Date of Patent: Sep. 9, 2003

(54) DOUBLE TRIGGERING MECHANISM FOR ACHIEVING FASTER TURN-ON

(75) Inventors: Christian Cornelius Russ, Princeton, NJ (US); Koen Gerard Maria Verhaege, Gistel (BE); Leslie Ronald Avery, Flemington, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/627,090

(22) Filed: Jul. 27, 2000

Related U.S. Application Data

(60) Provisional application No. 60/147,943, filed on Aug. 6, 1999.

(51) Int. Cl.[7] .............................................. H02H 3/22
(52) U.S. Cl. ....................... 361/111; 257/355; 257/173; 257/360; 361/56
(58) Field of Search .................... 361/111, 56; 257/355, 257/173, 360

(56) References Cited

U.S. PATENT DOCUMENTS

| | | | | |
|---|---|---|---|---|
| 5,452,171 A | | 9/1995 | Metz et al. ..................... 361/56 |
| 5,561,577 A | | 10/1996 | Motley ......................... 361/56 |
| 5,576,557 A | * | 11/1996 | Ker et al. | |
| 5,728,612 A | * | 3/1998 | Wei et al. | |
| 5,754,381 A | * | 5/1998 | Ker | |
| 5,894,153 A | * | 4/1999 | Walker et al. ............... 257/355 |
| 5,895,940 A | * | 4/1999 | Kim | |
| 5,905,288 A | * | 5/1999 | Ker | |
| 5,909,347 A | * | 6/1999 | Yu | |
| 6,011,681 A | * | 1/2000 | Ker et al. | |
| 6,091,595 A | * | 7/2000 | Sharpe-Geisler | |
| 6,130,117 A | * | 10/2000 | Walker et al. | |
| 6,288,884 B1 | * | 9/2001 | Yu | |
| 6,433,979 B1 | * | 8/2002 | Yu ............................... 361/56 |

FOREIGN PATENT DOCUMENTS

GB    2 218 872 A    11/1989    ............ H02H/1/04

* cited by examiner

*Primary Examiner*—Brian Sircus
*Assistant Examiner*—Isabel Rodriguez
(74) *Attorney, Agent, or Firm*—William J. Burke

(57) ABSTRACT

An ESD protection circuit includes a SCR and a switching means, such as a MOS transistor connected to the SCR so that the SCR is turned on by the switching means to allow an ESD pulse to pass from a Pad line to a grounded VSS line and thereby dissipate the ESD pulse. The SCR is connected between the Pad line and the VSS line. One MOS switching means is connected between the Pad line and the SCR and has a gate which is connected to a VDD line which maintains the switch in open condition during normal VDD bias conditions. An ESD pulse applied to the Pad line, the switch is preconditioned in ON mode allowing the SCR to be predisposed to conduction to allow the ESD pulse to flow to the VSS line.

11 Claims, 3 Drawing Sheets

DOUBLE TRIGGERING MECHANISM FOR ACHIEVING FASTER TURN-ON

This application claims the benefit of U.S. Provisional Application Serial No. 60/147,943 filed Aug. 6, 1999.

FIELD OF THE INVENTION

The present invention relates to an electrostatic discharge (ESD) protection circuit, and, more particularly, to an ESD protection circuit having a double triggering mechanism for achieving faster turn-on.

BACKGROUND OF THE INVENTION

In digital integrated circuits which include MOS transistors, protection against electrostatic discharge (ESD) is a problem. With the development of faster circuits in which the oxide thickness in the MOS transistor is made thinner, providing adequate levels of ESD protection has become an even greater problem. Silicon controlled rectifier (SCR) devices have heretofore been used for ESD protection. A major improvement for their use in CMOS technology has been the so-called low voltage triggering SCR circuits which incorporate a NMOS transistor to provide a lower triggering voltage than the normally predominating well-to-well breakdown and triggering circuits. FIG. 11 is a circuit diagram of a typical low-voltage triggering SCR ESD protection circuit, generally designated as 10. The low-voltage triggering SCR circuit 10 comprises an SCR 12 and a NMOS transistor 14 connected between a Pad line 13 and a VSS line 15. It should be understood that a typical SCR 12, as shown in FIG. 2, is a body of a semiconductor material having four layers 16, 18, 20 and 22. The layers are of alternating opposite conductivity types, such as the layers 16 and 20 being of P-type conductivity and the layers 18 and 22 being of N-type conductivity. Metal contact layers 24 and 26 are on the outer layers 16 and 22, and a metal contact 28 is on one of the inner layers, such as the layer 18. However, the SCR can be considered as being formed of two bipolar transistors, a PNP transistor and a NPN transistor, wherein the N-type layer of the PNP transistor is common with on the N-type layers of the NPN transistor, and one of the P-type layers of the PNP transistor is common with the P-type layer of the NPN transistor. Thus, in the circuit diagram of FIG. 1, the SCR 12 is shown electrically as being formed of a PNP transistor 30 and a NPN transistor 32. In the operation of the circuit, an electrostatic discharge on the pad 13 causes the MNOS transistor 14 to trigger turning on the SCR transistor 12. This allows the electrostatic discharge to flow to the VSS line 15 which is grounded. However, a problem common with the SCR is the triggering time. Because of the double injection mechanism in the SCR 12, two junctions have to be forward-biased. The total transit time is a function of the transit time of the NPN transistor and the transit time of the PNP transistor with the transit time of the PNP transistor being normally slower than that of the NPN transistor. Since an ESD protection circuit, particularly a SCR protection circuit, relies usually on a breakdown mechanism for its triggering, the slower transit time of the PNP transistor slows down the triggering time of the circuit. Therefore, it would be desirable to reduce the triggering time of a SCR protection circuit.

SUMMARY OF THE INVENTION

An ESD protection circuit includes a SCR connected between a Pad line and a VSS line. A switch is connected between the Pad line and the SCR. The switch is also connected to a VDD line which maintains the switch in an OFF condition under normal operation, but allows the switch to be ON during the unpowered condition. When an ESD pulse is applied to the Pad line, the switch is preconditioned in ON mode allowing the SCR to be predisposed to conduction to allow the ESD pulse to flow to the VSS line. A second switch may be connected between the SCR and VSS line.

DETAILED DESCRIPTION OF PREFERRED EMBODIMENTS

Figure 3:
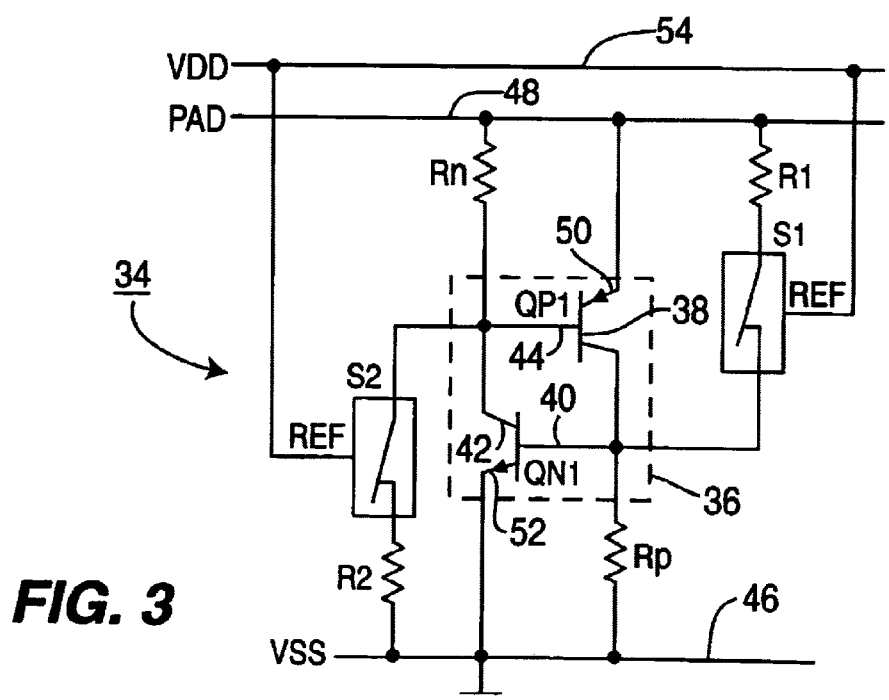
FIG. 3 is a circuit diagram of a SCR protection circuit incorporating the present invention.

Referring to FIG. 3, an ESD protection circuit which incorporates the present invention is generally designated as 34. ESD protection circuit 34 comprises a SCR 36 formed of a PNP transistor (QP1) and a NPN transistor (QN1). The collector 38 of the PNP transistor QP1 is electrically connected to the base 40 of the NPN transistor QN1 since they are provided by the same P-type region of the SCR 36. This common region of the SCR 36 will be referred to as the G1. The collector 42 of the NPN transistor QN1 is electrically connected to the base 44 of the PNP transistor QP1 since they are provided by the same N-type region of the SCR 36. This common region of the SCR 36 will be referred to as the G2. The base 40 of the NPN transistor QN1 is electrically connected to a VSS line 46 through a resistor Rp, and the base 44 of the PNP transistor QP1 Is electrically connected to a Pad line 48 through a resistor Rn. The emitter 50 of the PNP transistor QP1 is electrically connected to the Pad line 48, and the emitter 52 of the NPN transistor QN1 is electrically connected to the VSS line 46.

A switching element S1 is electrically connected between the Pad line 48 and the base 40 of the NPN transistor QN1, which is also the collector 38 of the PNP transistor QP1. A resistor R1 is electrically connected between the switching element S1 and the Pad line 48. A second switching element S2 is electrically connected between the VSS line 46 and the base 44 of the PNP transistor QP1, which is also the collector 42 of the NPN transistor QN1. A resistor R2 is electrically connected between the VSS line 46 and the switching element S2. The reference terminals Ref of each of the switching elements S1 and S2 are electrically connected to a VDD line 54.

In the operation of the protection circuit 34, the switches S1 and S2 are closed when the whole device is in a non-biased condition (under which the ESD stress would affect it). When an ESD pulse is applied to the circuit 34, the switches S1 and S2 remain closed because the VDD is capacitively coupled to VSS and charges up only slowly. This turns the SCR 34 on allowing the ESD current to flow to VSS, which is grounded. Thus, the protection circuit 34 shunts the ESD current through the SCR 38 to protect the circuit. The resistors R1 and R2 in series with the switching elements S1 and S2 limit the current and prevent possible damage in S1 and S2.

Figure 1:
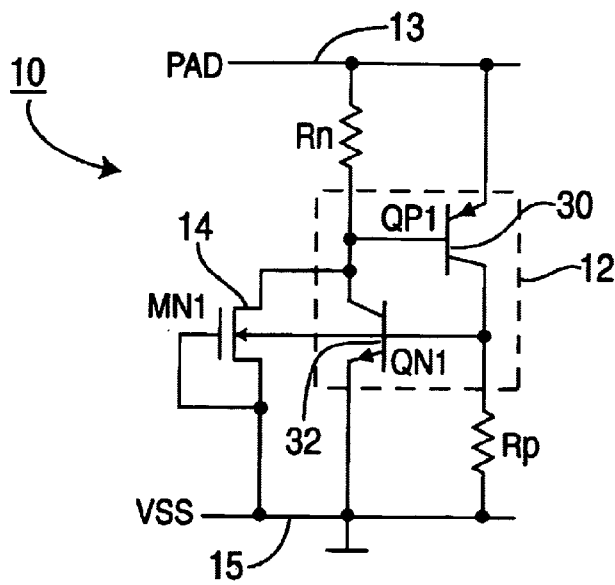
FIG. 1 is a circuit diagram of a typical prior art SCR protection circuit.
Figure 2:
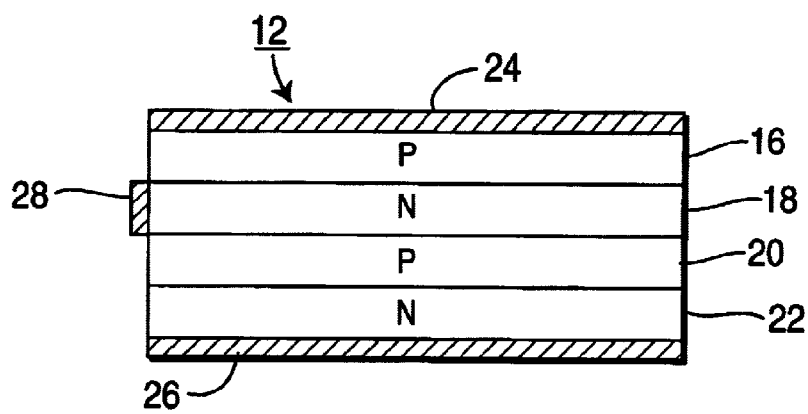
FIG. 2 is a sectional view of a typical SCR.
Figure 4:
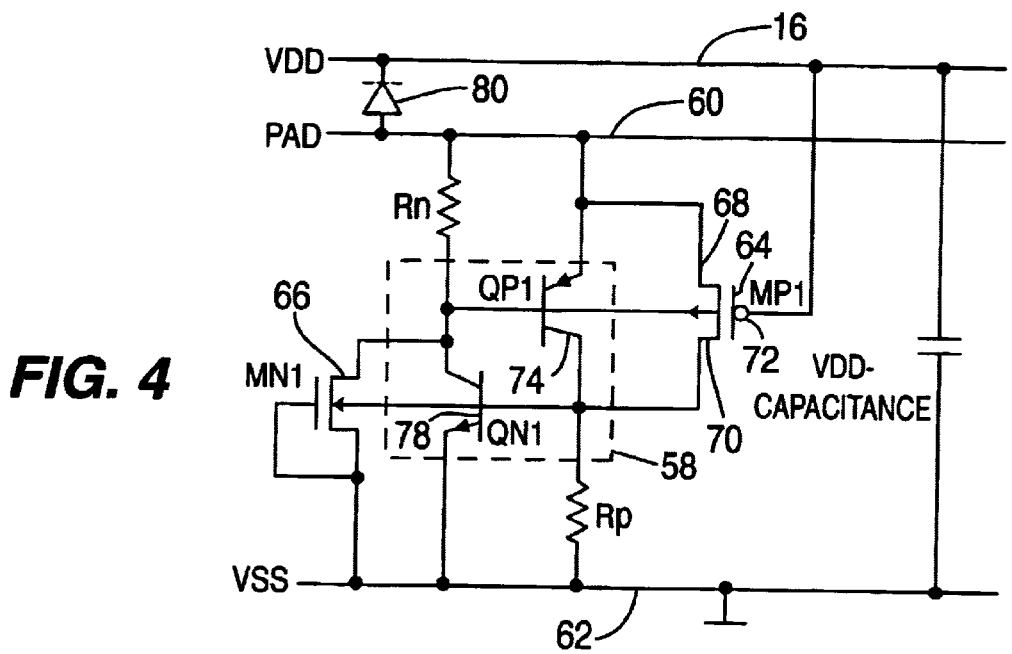
FIG. 4 is a circuit diagram showing one form of a circuit for carrying out the present invention.

Referring to FIG. 4, there is shown a protection circuit 56 which is a practical realization of the concept of the protection circuit 34 shown in FIG. 2. The circuit 56 comprises a SCR 58, which is shown as to be formed by a PNP transistor QP1 and a NPN transistor QN1. The transistors QP1 and QN1 are connected together and to the Pad line 60 and VSS line 62 in the same manner as previously described with regard to FIG. 3. A PMOS transistor 64 serves as the switch S1 and resistor R1 in the circuit 34 shown in FIG. 3, and a NMOS transistor 66 serves as the switch S2 and resistor R2 in the circuit 34. The source 68 of the PMOS transistor 64 is connected to the Pad line 60, and the drain 70 of the PMOS transistor 64 is connected to the base region 74 of the PNP transistor OP1 which is also the collector region of the PNP transistor QP1. The gate 72 of the PMOS transistor 64 is connected to a VDD line 76. The NMOS transistor 66 is connected between the VSS line 62 and the base region 78 of the PNP transistor QP1 which is also the collector region of the NPN transistor QN1. Optionally, a diode 80 may be connected between the Pad line 60 and the VDD line 76.

In the operation of the protection circuit 56, since the gate 72 of the PMOS transistor 64 is connected to the VDD line 76, a biased VDD line 76 turns the PMOS transistor 64 off. When the VDD line 76 is not biased, and a positive ESD pulse hits the Pad line 60 with the VSS line 62 being grounded, the VDD capacitance will keep the gate 72 of the PMOS transistor 64 on a low potential allowing current to flow to the base region 74 of the NPN transistor QN1. This triggers the SCR 58 immediately to the on-condition draining the ESD current to the VSS line 62 in a safe manner. The triggering current in this case is solely provided by the normally on PMOS transistor 64. Although the circuit 56 is shown as having herein the NMOS transistor 66, it is incorporated in the structure to provide a compact device layout and does not function in the operation of the circuit 56.

The diode 80 allows some of the ESD current to flow from the Pad line 60 to the VDD line 76 and to charge up the VDD capacitance. This does not compromise the functionality of the protection circuit 56 as the potential of the Pad line 60 will initially be a more than diode drop higher than the VDD line 76. Therefore, the PMOS transistor 68 will receive a negative gate-to-source bias around or higher than the threshold voltage such that the PMOS transistor 68 will stay in a conducting mode long enough to trigger the SCR 58 into conduction. Under normal circuit operation, the VDD potential is higher than the potential on Pad line 60 and PMOS transistor is off.

Figure 5:
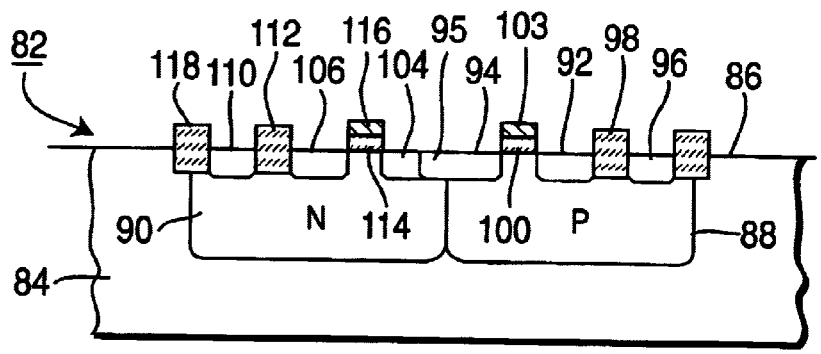
FIG. 5 is a sectional view of an integrated circuit which forms the circuit shown in FIG. 4.
Figure 6:
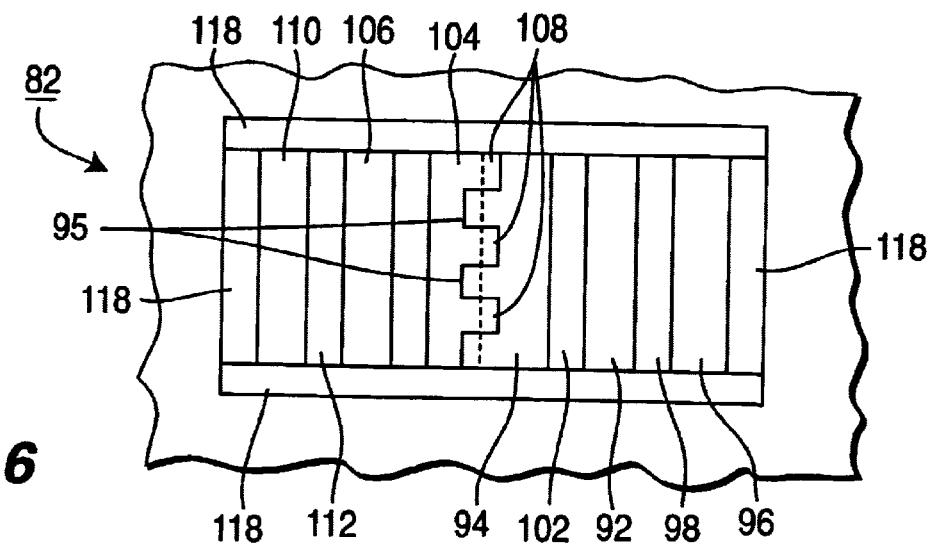
FIG. 6 is a top view of the integrated circuit of FIG. 5.

Referring to FIG. 5, there is shown a form of a semiconductor device, generally designated as 82, which forms the protection circuit 56 shown in FIG. 4. The semiconductor device 82 comprises a substrate 84 of a semiconductor material of either conductivity type having a surface 86. In the substrate 84 and at the surface 86 is a well region 88 of P-type conductivity. Also in the substrate 84 at the surface 86 and adjacent the P-type well region 88 is a well region 90 of N-type conductivity. In the P-type conductivity well 88 and at the surface 86 are two spaced regions 92 and 94 of N+ type conductivity which form the source and drain of a NMOS transistor. As shown in FIG. 5, the N+ region 94 is adjacent the junction between the P well 88 and the N well 90 and has a plurality of spaced fingers 95 which extend into the N well 90. In the P well 88 and at the surface 86 is a contact region 96 of P+ type conductivity. The contact region 96 is spaced from the N+ region 92 and an isolating strip 98 of an insulating material, such as silicon dioxide, is in the P well 88 between the P+ contact region 96 and the N+ region 92. A dielectric layer 100, such as of silicon dioxide, is on the surface 86 between the two N+ type regions 92 and 94. A layer 102 of a conductive material, such as doped polysilicon or a metal, is on the dielectric layer 100 and extends between the two N+ type regions 92 and 94. The conductive layer 102 forms the gate of the NMOS transistor.

In the N well 90 and at the surface 86 are a pair of spaced regions 104 and 106 of P+ type conductivity which form the drain and source of a PMOS transistor. The P+ region 104 is adjacent the junction between the P well 88 and N well 90 and has a plurality of spaced fingers 108 which extend into the P well 88. The P+ fingers 108 are interdigitated with the N+ fingers 95. However, the P+ fingers 108 are spaced from and therefore do not touch the interdigitated N+ fingers 95. If desired, an insulating material, such as silicon dioxide (not shown) may be provided between the interdigitated fingers 108 and 95. A contact region 110 of N+ type conductivity is in the N well 90 at the surface 86 and spaced from the P+ region 106. An isolation strip 112 of an insulating material, such as silicon dioxide, is in the N well 90 between the P+ region 106 and the contact region 110. A dielectric layer 114, such as of silicon dioxide, is on the surface 86 between the P+ regions 104 and 106. A layer 116 of a conductive material, such as doped polysilicon or a metal, is on the dielectric layer 114 to form the gate of the PMOS transistor. A strip 118 of an insulating material, such as silicon dioxide is in the substrate 84 and completely surrounds the device.

In the semiconductor device 82, the N+ region 92, P well 88, N well 90 and P+ region 106 form the SCR 58 of the circuit 56 shown in FIG. 4. The N+ regions 92 and 94, the P well 88, the dielectric layer 100 and the conductive layer 102 form the NMOS transistor 66 of the circuit 56. The P+ regions 104 and 106, N well 90, dielectric layer 114 and conductive layer 116 form the PMOS transistor 64 of the circuit 56. The conductive layers 102 and 116, which are the gates of the NMOS transistor 66 and the PMOS transistor 64 respectively, are connected together to form the desired circuit either by conductive strips (not shown) in or on the substrate 84 or by external wires. The interdigitated fingers 95 and 108 of the N+ region 92 and P+ region 104 provide the necessary connections for the PMOS transistor 64 and NMOS transistor 66 so that they operate as the switches S1 and S2 of the circuit shown in FIG. 3.

Figure 7:
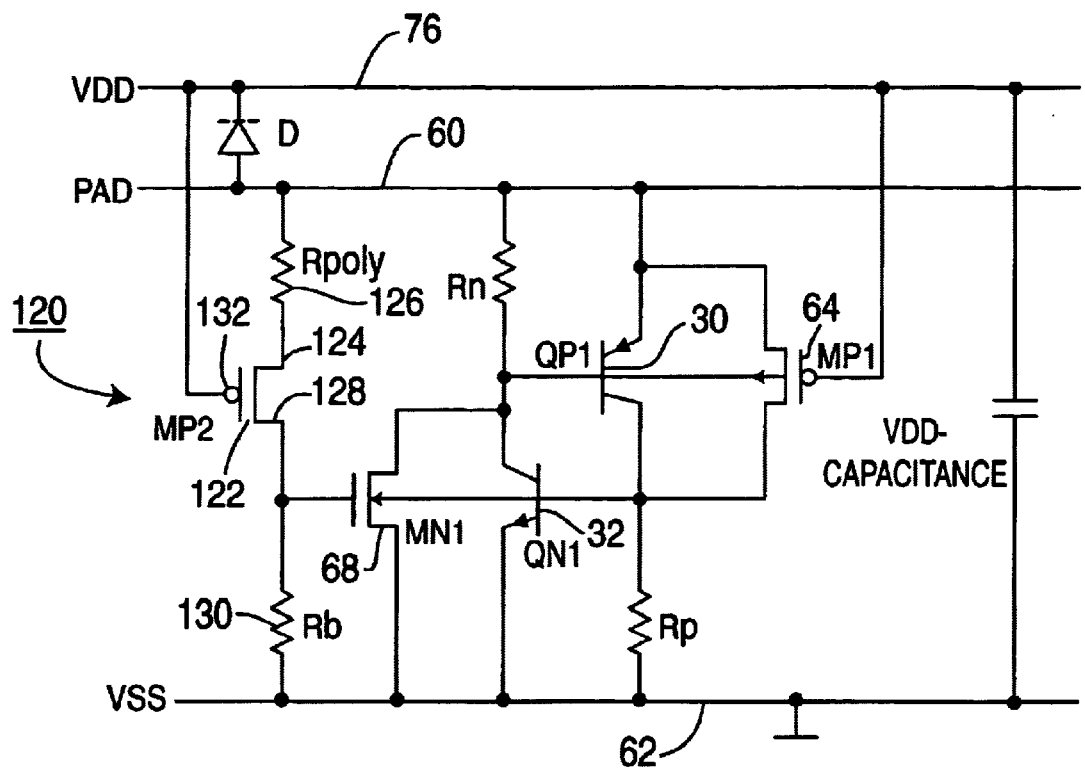
FIG. 7 is a circuit diagram of another form of the circuit of the present invention.

Referring to FIG. 7, a more preferred form of the protection circuit of the present invention is generally designated as 120. Circuit 120 is identical to the protection circuit 56 shown in FIG. 4 except that it includes a second PMOS transistor 122. The source 124 of the PMOS transistor 122 is connected to the Pad line 60 through a resistor 126. The drain 128 of the PMOS transistor 122 is connected to (1) VSS line 62 through a high ohmic resistor 130 and (2) the gate of NMOS transistor 68. The gate 132 of the PMOS transistor 122 is connected to the VDD line 76.

The circuit 120 allows an improved triggering as the base regions of both the PNP transistor 30 and the NPN transistor 32 are biased. For biased VDD, the PMOS transistor 64 and NMOS transistor 68 are in the Off state, keeping the SCR ESD clamp also in the Off state. The resistor 126 is provided to limit the current in case of an unintended breakdown of the source junction 124 of PMOS transistor 122 during an ESD event.

Figure 8:
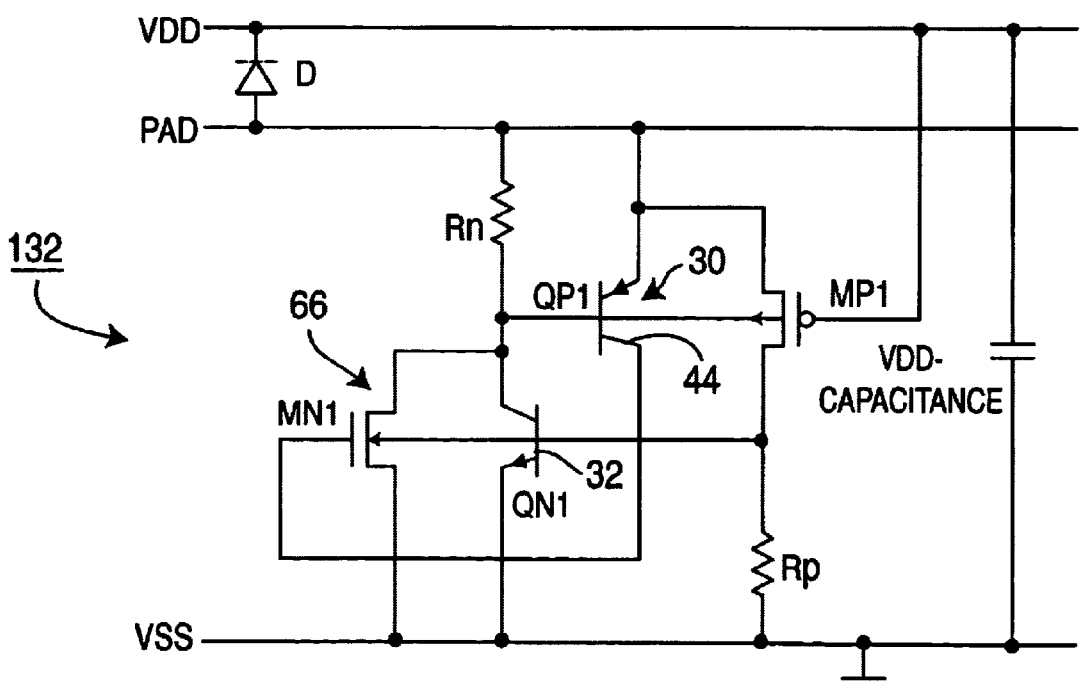
FIG. 8 is a circuit diagram of still another form of the circuit of the present invention.

Referring to FIG. 8, still another form of the protection circuit of the present invention is generally designated as 132. Circuit 132 is identical to the circuit 56 shown in FIG. 4 except that in the circuit 56, the NMOS transistor 66 is not used, whereas in the circuit 132 the NMOS transistor 66 is utilized by connecting the gate of the NMOS transistor 66 to the base 44 of the NPN transistor 32. In the circuit 132, the gate bias for the NMOS transistor 66 is picked up as local substrate potential from the base region of the NPN transistor 32.

Thus, there is provided by the present invention an ESD protection circuit which includes a SCR connected between a Pad line and a VSS line, and a switching means, such as a PMOS transistor, connected between the Pad line and the SCR. A second switch in the form of a NMOS transistor may be connected between the SCR and the VSS line. The switches are also connected to a VDD line which will maintain the switches in open condition when the VDD line is biased. When the VDD line is not biased, and a positive ESD pulse on the Pad line during an unpowered condition will keep the PMOS transistor on a low potential allowing current to flow to the base region of the NPN transistor. This triggers the SCR immediately in on-condition allowing the pulse to pass to the VSS line, which is grounded. Thus, this is an double triggering action which provides a faster operating time for the protection circuit to allow the dissipation of the ESD pulse.

What is claimed:

1. An ESD protection circuit for operating with a Pad line, a VSS line, and a VDD line, comprising:
    a SCR for being connected between the Pad line and the VSS line; and
    a switch for being connected between the Pad line, the SCR, and the VDD line which maintains the switch in OFF condition so that when an ESD pulse is applied to the Pad line, the switch is preconditioned in ON condition allowing the SCR to be predisposed to conduction allowing the ESD pulse to flow to the VSS line.

2. The protection circuit of claim 1 wherein the switch is a MOS transistor having a source connected to the Pad line, a drain connecting to the SCR and a gate connected to the VDD line.

3. The protection circuit of claim 2 wherein the SCR is essentially the combination of a PNP bipolar transistor and a NPN bipolar transistor with the P type collector of the PNP transistor being common with the P type base region of the NPN transistor and the N type base region of the PNP transistor being common with the N type collector region of the NPN transistor, and the emitters of the PNP and NPN transistors being electrically connected to the Pad line and VSS line respectively so that the SCR is turned ON by simultaneous injection into the two common regions of the PNP and NPN transistors.

4. The protection circuit of claim 3 including a separate resistor connected between each of the common regions of the bipolar transistor and the Pad line and VSS line respectively.

5. The protection circuit of claim 3 wherein the MOS transistor is a PMOS transistor with the drain being connected to the joint P type region of the bipolar transistors.

6. The protection circuit of claim 5 further comprising a diode connected between the Pad line and the VDD line.

7. The protection circuit of claim 5 further comprising a NMOS transistor connected between the VSS line and the N type joint region of the bipolar transistors.

8. The protection circuit of claim 7 in which the NMOS transistor has a drain which is connected to the N type joint region of the bipolar transistors and a source which is connected to the VSS line.

9. The protection circuit of claim 8 in which the NMOS transistor has a gate which is connected to the joint P type regions of the bipolar transistors.

10. The protection circuit of claim 8 further comprising a second PMOS transistor having a source connected to the Pad line, a drain connected to the VSS line and the gate of the NMOS transistor, and a gate connected to the VDD line.

11. The protection circuit of claim 10 including a separate resistor connected between each of the source and drain regions of the second PMOS transistor and the Pad line and VSS line respectively.

* * * * *